United States Patent
Loy et al.

(10) Patent No.: US 10,066,999 B2
(45) Date of Patent: Sep. 4, 2018

(54) SYSTEM AND METHOD FOR MONITORING EXCEPTIONAL WATT HOUR METER TERMINAL TEMPERATURE

(71) Applicant: ELSTER SOLUTIONS, LLC, Raleigh, NC (US)

(72) Inventors: Garry M. Loy, Raleigh, NC (US); David Cooper, Raleigh, NC (US)

(73) Assignee: Elster Solutions, LLC, Raleigh, NC (US)

( * ) Notice: Subject to any disclaimer, the term of this patent is extended or adjusted under 35 U.S.C. 154(b) by 230 days.

(21) Appl. No.: 14/861,824

(22) Filed: Sep. 22, 2015

(65) Prior Publication Data
US 2017/0082501 A1  Mar. 23, 2017

(51) Int. Cl.
| | | |
|---|---|---|
| *G01K 1/14* | (2006.01) | |
| *G01K 3/14* | (2006.01) | |
| *G01K 7/04* | (2006.01) | |
| *G01R 21/00* | (2006.01) | |

(52) U.S. Cl.
CPC ............. *G01K 1/14* (2013.01); *G01K 3/14* (2013.01); *G01K 7/04* (2013.01); *G01R 21/00* (2013.01)

(58) Field of Classification Search
CPC ...................................................... G01K 3/14
USPC .......................................................... 374/113
See application file for complete search history.

(56) References Cited

U.S. PATENT DOCUMENTS

| | | | | |
|---|---|---|---|---|
| 2,117,027 | A * | 5/1938 | Langbein | B60T 17/22 188/1.11 L |
| 2,647,237 | A | 7/1953 | Herbst | |
| 3,167,957 | A | 2/1965 | Ziviani | |
| 3,939,711 | A * | 2/1976 | Hanaoka | F02P 17/00 374/113 |
| 7,014,949 | B2 * | 3/2006 | Kanai | H01M 2/105 429/120 |
| 8,830,083 | B2 * | 9/2014 | LaFrance | G01D 4/004 340/870.02 |
| 8,854,217 | B2 * | 10/2014 | Brown | G01D 4/00 340/584 |

(Continued)

FOREIGN PATENT DOCUMENTS

| | | |
|---|---|---|
| JP | 02142313 A * | 5/1990 |
| KR | 10-1024628 B1 | 3/2011 |
| WO | WO 96/31784 A1 | 10/1996 |

*Primary Examiner* — Clayton E LaBalle
*Assistant Examiner* — Leon W Rhodes, Jr.
(74) *Attorney, Agent, or Firm* — Baker & Hostetler LLP

(57) ABSTRACT

An electricity meter may include a plurality of current terminals and a temperature sensing circuit. The circuit has a first set of thermocouple junctions having a first observed polarity and a second set of thermocouple junctions having a second observed polarity that is opposite of the first observed polarity. Each of the first set and the second set are disposed adjacent to a respective current terminal so as to measure relative temperature changes at the respective current terminal Each of the first set and the second set are connected to each other in series such that when each of the current terminals are at the same temperature, the temperature sensing circuit has a net voltage of zero. Alternatively, when one or more of the terminals has a temperature that is different from the other terminals, the temperature sensing circuit has a net voltage that is greater or less than zero.

15 Claims, 4 Drawing Sheets

(56) References Cited

U.S. PATENT DOCUMENTS

| | | | |
|---|---|---|---|
| 8,885,313 B2* | 11/2014 | Zhou | H01H 71/123 |
| | | | 361/115 |
| 9,052,351 B2* | 6/2015 | Reed | G01R 31/04 |
| 9,343,723 B2* | 5/2016 | Yoon | B60L 11/187 |
| 9,651,510 B2* | 5/2017 | Hironaka | H02M 1/32 |
| 2010/0036624 A1 | 2/2010 | Martin et al. | |
| 2010/0036625 A1 | 2/2010 | Martin et al. | |

\* cited by examiner

SYSTEM AND METHOD FOR MONITORING EXCEPTIONAL WATT HOUR METER TERMINAL TEMPERATURE

TECHNICAL BACKGROUND

Monitoring internal temperature of watt hour electricity meters may be done to provide an indication of meter failure, such as a fault condition in the meter or the meter socket, because such failures typically cause meter temperature to rise. For example, as current conductors within an electricity meter age and oxidize and corrode over time at connection interfaces, electricity passing through these conductors generates heat, raising the temperature of the meter. If not repaired, this heat buildup can result in fire. State-of-the-art meters include temperature monitoring systems that measure absolute rise in meter temperature.

SUMMARY OF THE DISCLOSURE

By measuring absolute rise in meter temperature, prior art temperature monitoring systems fail to distinguish between increase in ambient temperature and temperature increase due to meter failure. The systems and methods for monitoring exceptional watt hour meter terminal temperature are disclosed herein are configured to distinguish between increase in ambient temperature and temperature increase due to meter failure. An electricity meter includes a plurality of current terminals. The meter further includes a temperature sensing circuit. The temperature sensing circuit has a first set of thermocouple junctions having a first observed polarity and a second set of thermocouple junctions having a second observed polarity, the second observed polarity being the opposite of the first observed polarity. Each of the thermocouple junctions of the first set and the second set are disposed adjacent to a respective current terminal of the plurality of current terminals so as to measure relative temperature changes at the respective current terminal Each of the first set of thermocouple junctions and the second set of thermocouple junctions are connected to each other in series. Accordingly, in operation, when each of the current terminals are at the same temperature, the temperature sensing circuit has a net voltage of zero. Alternatively, when one or more of the current terminals has a temperature that is different from the other current terminals, the temperature sensing circuit has a net voltage that is greater or less than zero.

Also disclosed herein is a method of monitoring exceptional watt hour meter terminal temperature in an electricity meter having a plurality of current terminals and a temperature sensing circuit. The temperature sensing circuit includes a first set of thermocouple junctions having a first observed polarity and a second set of thermocouple junctions having a second observed polarity. The second observed polarity is the opposite of the first observed polarity. Each of the thermocouple junctions of the first set and the second set disposed adjacent to a respective current terminal of the plurality of current terminals and connected to each other in series. The method includes a step of measuring relative temperature changes at each of the plurality of meter terminals using a voltage produced by each of the thermocouple junctions. The method also includes a step of determining, based on a net voltage in the temperature sensing circuit, if one or more of the current terminals has a temperature that is different from the other current terminals. When each of the current terminals are at the same temperature, the temperature sensing circuit has a net voltage of zero. When one or more of the current terminals has a temperature that is different from the other current terminals, the temperature sensing circuit has a net voltage that is greater or less than zero.

Additionally, a temperature sensing circuit configured to measure variations in temperature at points throughout the circuit is disclosed herein. The temperature sensing circuit includes a first set of thermocouple junctions having a first observed polarity and a second set of thermocouple junctions having a second observed polarity. The second observed polarity is the opposite of the first observed polarity. Each of the thermocouple junctions of the first set and the second set disposed adjacent to measurement points so as to measure relative temperature changes at the respective measurement points. Each of the first set of thermocouple junctions and the second set of thermocouple junctions are connected to each other in series. In operation, when each of the measurement points are at the same temperature, the temperature sensing circuit has a net voltage of zero. Alternatively, when one or more of the measurements points has a temperature that is different from the other measurement points, the temperature sensing circuit has a net voltage that is greater or less than zero.

Other features and advantages of the described embodiments may become apparent from the following detailed description and accompanying drawings.

BRIEF DESCRIPTION OF THE DRAWINGS

The foregoing summary, as well as the following detailed description of various embodiments, is better understood when read in conjunction with the appended drawings. For the purpose of illustrating the invention, there are shown in the drawings exemplary embodiments of various aspects of the invention; however, the invention is not limited to the specific methods and instrumentalities disclosed. In the drawings.

DETAILED DESCRIPTION OF ILLUSTRATIVE EMBODIMENTS

Exemplary systems and methods for monitoring exceptional watt hour meter terminal temperature are described below with reference to the figures. It will be appreciated by those of ordinary skill in the art that the description given herein with respect to those figures is for exemplary purposes only and is not intended in any way to limit the scope of potential embodiments.

Figure 1:
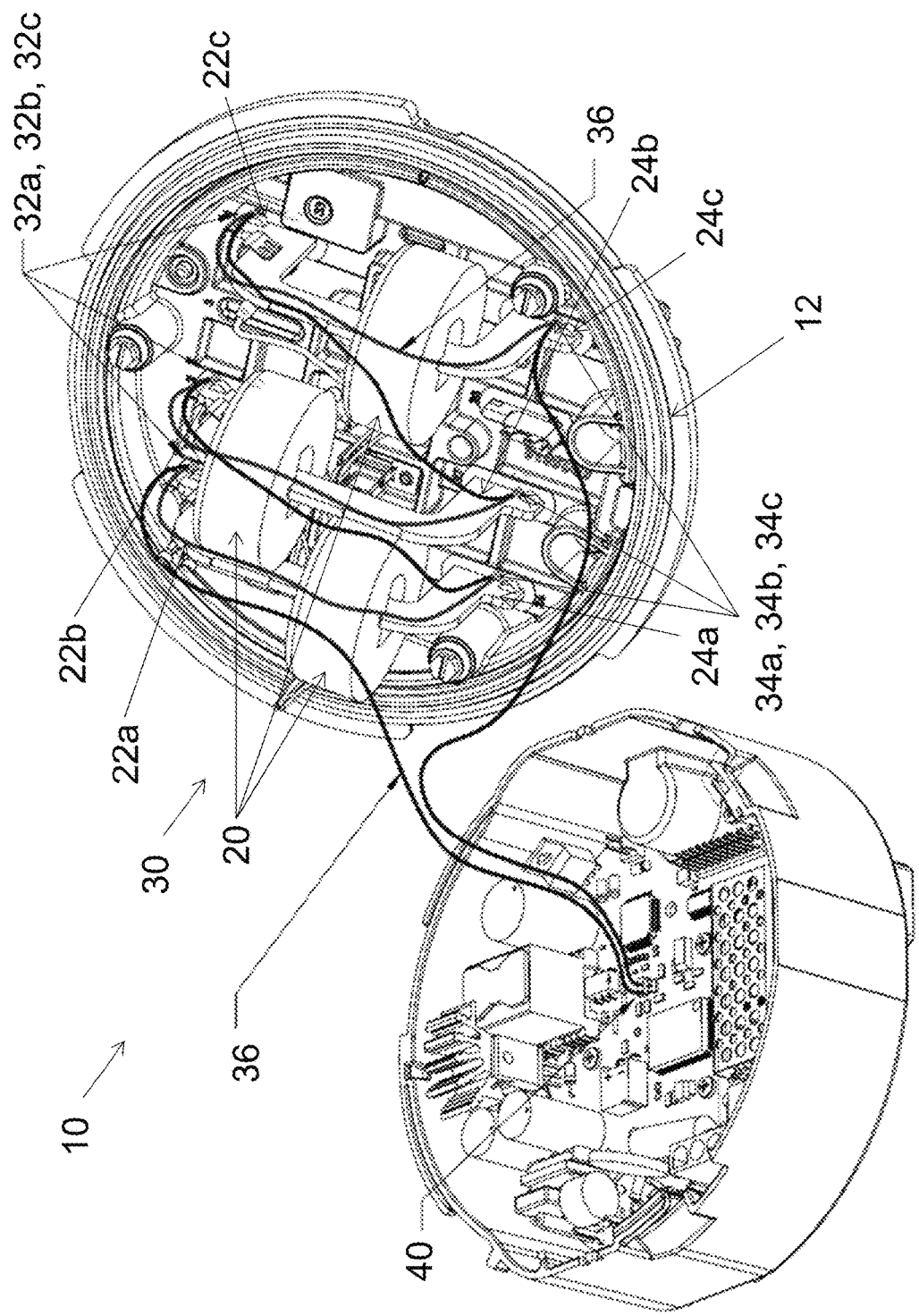
FIG. 1 is an illustration of an exemplary three-phase electricity meter that includes a temperature sensing circuit.
Figure 2:
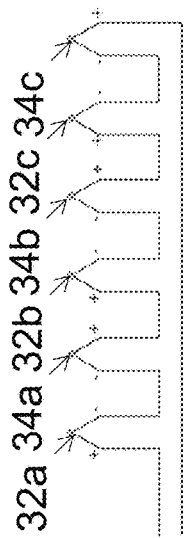
FIG. 2 is a schematic of the temperature sensing circuit shown in FIG. 1.
Figure 3:
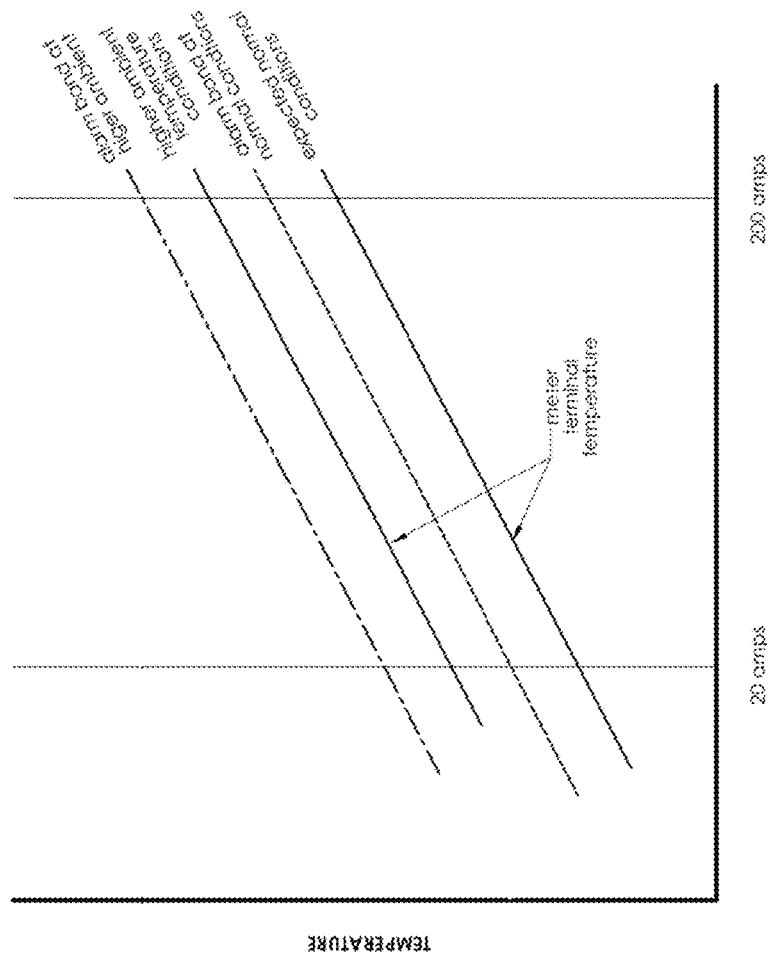
FIG. 3 is a graph of alarm settings of the temperature sensing circuit.

FIGS. 1-3 illustrate various aspects of a temperature sensing circuit 30 and associated methods for a watt hour meter 10. In particular, FIG. 1 shows an embodiment of a watt hour meter 10, such as a three phase watt hour meter, having a meter base 12. In the embodiment shown, the meter 10 comprises current sensors 20, line current terminals 22a, 22b, 22c and load current terminals 24a, 24b, 24c. The watt hour meter 10 also includes the temperature sensing circuit 30. The temperature sensing circuit 30 includes a first set of thermocouple junctions 32a, 32b, 32c having a first observed polarity and a second set of thermocouple junctions 34a, 34b, 34c having a second observed polarity, which is opposite the first observed polarity. In other words, the first set of thermocouple junctions 32a, 32b, 32c may have an observed polarity of +/−, while the second set of thermocouple junctions 34a, 34b, 34c has an observed polarity of −/+, or vice versa. While FIG. 1 depicts the first set of thermocouple junctions 32a, 32b, 32c as being associated with the line current terminals 22a, 22b, 22c, and the second set of thermocouple junctions 34a, 34b, 34c being associated with the load current terminals 24a, 24b, 24c, the first set of thermocouple junctions 32a, 32b, 32c may instead being associated with the load current terminals 24a, 24b, 24c or a combination of the line current terminals 22a, 22b, 22c, and the load current terminals 24a, 24b, 24c.

Each of the thermocouple junctions 32a, 32b, 32c, 34a, 34b, 34c is disposed adjacent to a respective current terminal 22a, 22b, 22c, 24a, 24b, 24c. For example, as shown in FIG. 1, each of the thermocouple junctions 32a, 32b, 32c, 34a, 34b, 34c is disposed immediately adjacent to and/or touching a respective current terminal 22a, 22b, 22c, 24a, 24b, 24c. Each thermocouple junction 32a, 32b, 32c, 34a, 34b, 34c is disposed so as to measure relative temperature changes at its respective current terminal 22a, 22b, 22c, 24a, 24b, 24c. The thermocouple junctions 32a, 32b, 32c, 34a, 34b, 34c are disposed proximate to each terminal's respective contact area with meter socket jaws (not shown). Because terminals 22a, 22b, 22c, 24a, 24b, 24c may be made of copper, which has outstanding thermal conductivity, thermocouple junctions 32a, 32b, 32c, 34a, 34b, 34c may be disposed inside the meter base 12 near each terminal's exit from the inside of the base to the outside. For example, thermocouple junctions 32a, 32b, 32c, 34a, 34b, 34c may be electrically isolated from each terminal's respective contact area with meter socket jaws by taking advantage of dielectric properties of the meter base material. In some embodiments, thermocouple junctions 32a, 32b, 32c, 34a, 34b, 34c may each be disposed in a molded-in groove in the meter base 12 leading to a blind hole or pocket very close to the meter terminal that is used to route the thermocouple wires 36. Thermocouple junctions 32a, 32b, 32c, 34a, 34b, 34c generally have the same relative position to each terminal 22a, 22b, 22c, 24a, 24b, 24c.

The first set of thermocouple junctions 32a, 32b, 32c and the second set of thermocouple junctions 34a, 34b, 34c are connected to each other in series via a wire 36, or a series of wires 36. For example, and with reference to FIGS. 1 and 2, junction 32a may be connected to junction 34a, which in turn is connected to junction 32b, which is connected to junction 34b, which is connected to 32c, which is connected to 34c. Alternatively, junction 32a may be connected to junction 32b, which in turn is connected to junction 32c, which is connected to junction 34c, which is connected to 34b, which is connected to 34a. Numerous other combinations of connections may be used to connect each of the first set of thermocouple junctions 32a, 32b, 32c and the second set of thermocouple junctions 34a, 34b, 34c in series.

Wires 36 of the temperature sensing circuit 30 attach the temperature sensing circuit 30 to a circuit board 40 that receives an electrical signal from the circuit 30. In operation, because the first set of thermocouple junctions 32a, 32b, 32c have a first observed polarity, the second set of thermocouple junctions 34a, 34b, 34c have a second observed polarity that is opposite of the first polarity, and the thermocouple junctions 32a, 32b, 32c, 34a, 34b, 34c are all connected in series, when each of the current terminals 22a, 22b, 22c, 24a, 24b, 24c are at the same temperature, the temperature sensing circuit 30 has a net voltage of zero (or approximately zero). Specifically, manufacturing tolerances and material differences may cause the voltage to be more or less than zero, such as a fraction of a volt. Such a number may be determined empirically. However, when one or more of the current terminals has a temperature that is different from the other current terminals, indicating a potential fault condition in the meter 10 or the meter socket (not shown), the temperature sensing circuit 30 has a net voltage that is greater or less than zero (or approximately zero). Specifically, if only one or a portion of the total number of current terminals 22a, 22b, 22c, 24a, 24b, 24c is at a different temperature, then the temperature sensing circuit 30 voltage will be proportional to the difference in temperature between the exceptional measurement(s) and the average temperature of all of the remaining current terminals 22a, 22b, 22c, 24a, 24b, 24c.

In this way, the thermocouple junctions 32a, 32b, 32c, 34a, 34b, 34c monitor when or if the temperature of only one or more of current terminals 22a, 22b, 22c, 24a, 24b, 24c deviate(s) from the temperature of the remaining terminals. Under normal operating conditions, the temperature of all of the current terminals 22a, 22b, 22c, 24a, 24b, 24c is approximately equal. However, if a fault condition exists in the meter 10 or the meter terminal (not shown), at least one but not all current terminals 22a, 22b, 22c, 24a, 24b, 24c would experience a temperature increase. In this way, even though thermocouple junctions 32a, 32b, 32c, 34a, 34b, 34c are used in this invention, temperatures are not actually measured. Consequently, supporting electronics, such as reference junctions, display drivers, etc., typically used to decode the thermocouple output signals are not needed to determine if an alarm condition exists. Instead, only a D.C. voltage signal is produced by the circuit 30. Interpretation of this signal may be accomplished by electronic devices such as an op amp (not shown).

With reference now to FIG. 3, under normal operating conditions, the absolute temperature within the meter 10 and, correspondingly, at current terminals 22a, 22b, 22c, 24a, 24b, 24c may vary significantly with the electrical current passing through the meter and the environmental conditions. For example, even at expected normal conditions, as current in the meter 10 increases, so does the temperature of the meter 10. Further, when the meter is exposed to higher than normal ambient temperature, the temperature of meter 10 rises even further. These temperature variations make detection of an alarm condition problematic because mere temperature measurement of the meter 10 does not distinguish between high temperature cause by high ambient temperature and/or high current and a fault condition in the meter and/or meter socket. In other words, measuring absolute temperature rather than temperature variability typically involves setting an alarm band for a "worst case scenario" temperature level which results in a larger than ideal differential between normal operating temperature and alarm temperature for a fault condition. The threshold voltage generated by the circuit 30 during a fault condition is measured independently of electrical current passing through the meter and the environmental conditions, such that the circuit 30 may more accurately detect a fault condition at any given set of operating conditions.

By instead measuring temperature using thermocouple junctions 32a, 32b, 32c, 34a, 34b, 34c at each of the current terminals 22a, 22b, 22c, 24a, 24b, 24c, respectively, temperature sensing circuit 30 monitors current terminals 22a, 22b, 22c, 24a, 24b, 24c individually. When the net voltage is zero, or approximately zero, the temperatures at current terminals 22a, 22b, 22c, 24a, 24b, 24c is the same, or approximately the same. However, when the net voltage is greater or less than zero, the temperature at at least one of the current terminals 22a, 22b, 22c, 24a, 24b, 24c is greater than temperature at the other terminals, indicating that a fault condition may exist. Accordingly, instead of relying on the alarm band for higher ambient temperatures, the alarm band for normal conditions may be used in conjunction with measuring variance in the temperature of at least one of the current terminals 22a, 22b, 22c, 24a, 24b, 24c to determine if a fault condition exists.

Figure 4:
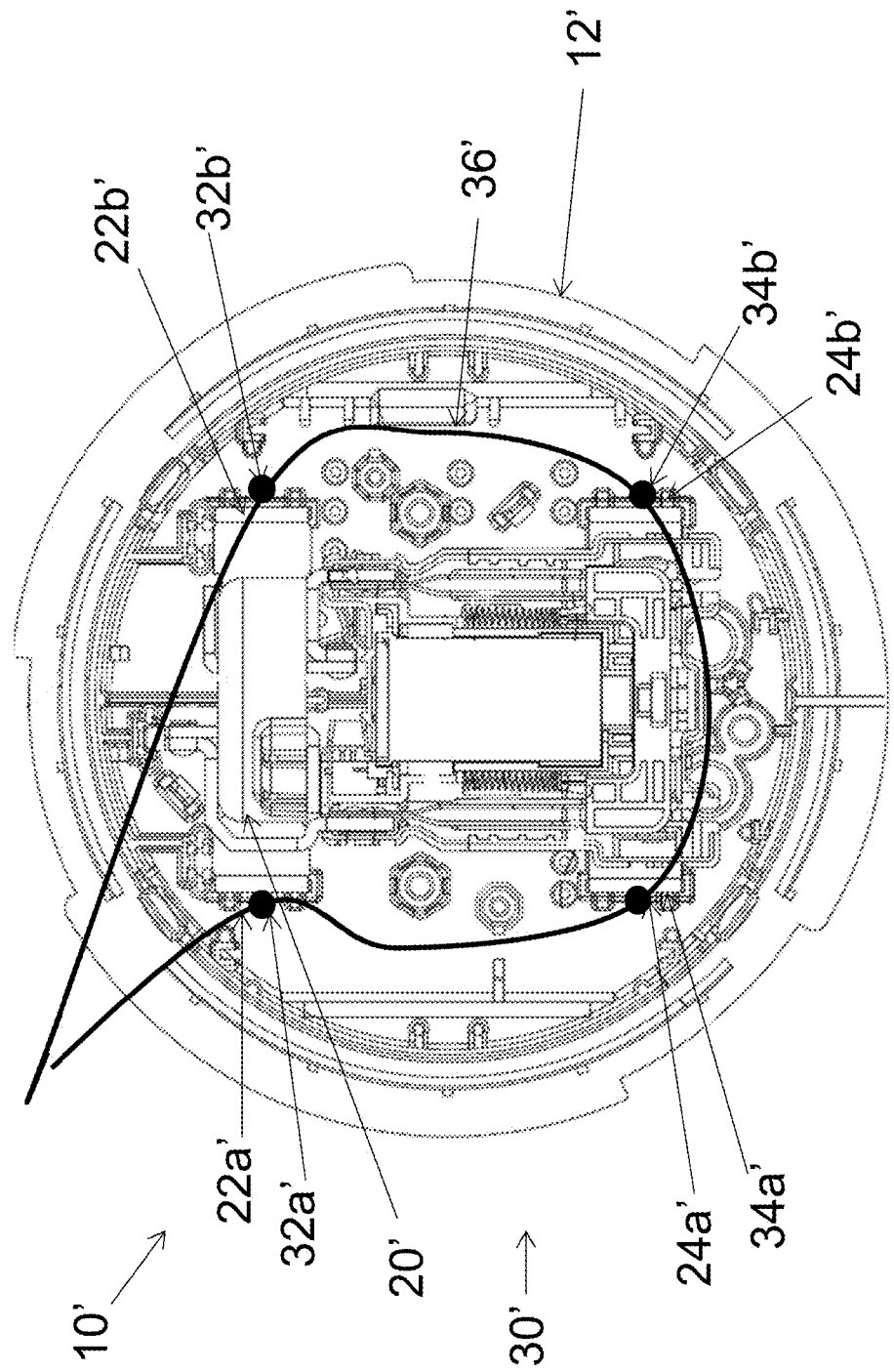
FIG. 4 is an illustration of an exemplary single-phase electricity meter that includes a temperature sensing circuit.

FIG. 4 depicts an alternative configuration to the temperature sensing circuit 30 shown and described in relation to FIGS. 1-3. Instead of being applied to a meter 10' that is a three phase watt hour meter, as shown in FIGS. 1-3, temperature sensing circuit 20' may alternatively be used in a meter 10' that is a single phase watt hour meter. In the embodiment shown, the meter 10' comprises a meter base 12', a current sensor 20', line current terminals 22a', 22b', and load current terminals 24a', 24b'. The watt hour meter 10' also includes a temperature sensing circuit 30'. The temperature sensing circuit 30' includes a first set of thermocouple junctions 32a', 32b', having a first observed polarity and a second set of thermocouple junctions 34a', 34b', having a second observed polarity, which is opposite the first observed polarity. In other words, the first set of thermocouple junctions 32a', 32b', may have an observed polarity of +/−, while the second set of thermocouple junctions 34a', 34b' has an observed polarity of −/+, or vice versa. While FIG. 4 depicts the first set of thermocouple junctions 32a', 32b', as being associated with the line current terminals 22a', 22b', and the second set of thermocouple junctions 34a', 34b', being associated with the load current terminals 24a', 24b', the first set of thermocouple junctions 32a', 32b', may instead being associated with the load current terminals 24a', 24b' or a combination of the line current terminals 22a', 22b' and the load current terminals 24a', 24b'.

Each of the thermocouple junctions 32a', 32b', 34a', 34b' is disposed adjacent to a respective current terminal 22a', 22b', 24a', 24b'. For example, as shown in FIG. 4, each of the thermocouple junctions 32a' 32b', 34a', 34b' is disposed immediately adjacent to and/or touching a respective current terminal 22a', 22b', 24a', 24b'. Each thermocouple junction 32a', 32b', 34a', 34b' is disposed so as to measure relative temperature changes at its respective current terminal 22a', 22b', 24a', 24b'. As described above in relation to FIG. 1, thermocouple junctions 32a', 32b', 34a', 34b' are disposed proximate to each terminal's respective contact area with meter socket jaws (not shown). Because terminals 22a', 22b', 24a', 24b' may be made of copper, which has outstanding thermal conductivity, thermocouple junctions 32a', 32b', 34a', 34b' may be disposed inside the meter base 12' near each terminal's exit from the inside of the base to the outside. For example, thermocouple junctions 32a', 32b', 34a', 34b' may be electrically isolated from each terminal's respective contact area with meter socket jaws by taking advantage of dielectric properties of the meter base material. In some embodiments, thermocouple junctions 32a', 32b', 34a', 34b may each be disposed in a molded-in groove in the meter base 12' leading to a blind hole or pocket very close to the meter terminal that is used to route the thermocouple wires 36'. Thermocouple junctions 32a', 32b', 34a', 34b' generally have the same relative position to each terminal 22a', 22b', 24a', 24b'.

The first set of thermocouple junctions 32a', 32b' and the second set of thermocouple junctions 34a', 34b' are connected to each other in series via a wire 36', or a series of wires 36'. For example, and with reference to FIG. 4, junction 32a' may be connected to junction 34a', which in turn is connected to junction 34b', which is connected to junction 32a'. Alternatively, junction 32a' may be connected to junction 34a', which in turn is connected to junction 32b', which is connected to junction 34b'. Numerous other combinations of connections may be used to connect each of the first set of thermocouple junctions 32a', 32b' and the second set of thermocouple junctions 34a', 34b' in series.

Wires 36' of the temperature sensing circuit 30' attach the temperature sensing circuit 30' to a circuit board, such as the circuit board 40 of the meter 10 shown in FIG. 1, that receives an electrical signal from the circuit 30'. As described above in relation to the embodiment shown in FIGS. 1-3, in operation, because the first set of thermocouple junctions 32a', 32b' have a first observed polarity, the second set of thermocouple junctions 34a', 34b' have a second observed polarity that is opposite of the first polarity, and the thermocouple junctions 32a', 32b', 34a', 34b' are all connected in series, when each of the current terminals 22a', 22b', 24a', 24b' are at the same temperature, the temperature sensing circuit 30' has a net voltage of zero (or approximately zero). However, when one or more of the current terminals has a temperature that is different from the other current terminals, indicating a potential fault condition in the meter 10' or the meter socket (not shown), the temperature sensing circuit 30' has a net voltage that is greater or less than zero (or approximately zero). Again, as described above, if only one or a portion of the total number of current terminals 22a', 22b', 24a', 24b' is at a different temperature, then the temperature sensing circuit 30' voltage will be proportional to the difference in temperature between the exceptional measurement(s) and the average temperature of all of the remaining current terminals 22a', 22b', 24a', 24b'.

Figure 5:
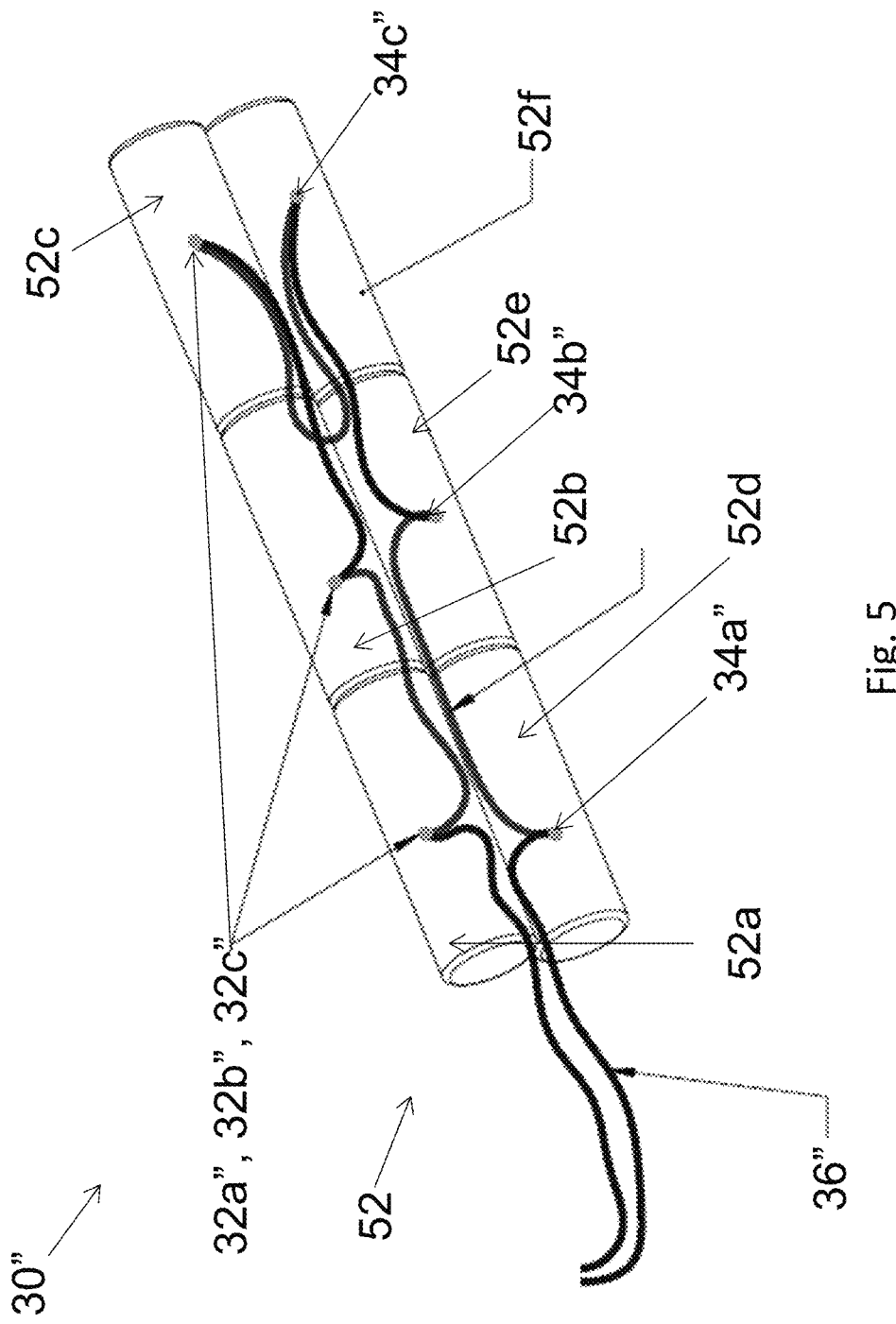
FIG. 5 is a diagram of a temperature sensing circuit applied to a multi-cell battery.

A temperature sensing circuit 30" similar to those shown and described in relation to FIGS. 1-4 is shown in FIG. 5 in use on a multi-cell battery 50. Multi-cell batteries 50, such as lithium-ion batteries, have various applications such as hand-held electronics, automobiles, and airplanes. The temperature sensing circuit 30" shown in FIG. 5 includes a first set of thermocouple junctions 32a", 32b", 32c" having a first observed polarity and a second set of thermocouple junctions 34a", 34b", 34c" having a second observed polarity. In other words, the first set of thermocouple junctions 32a", 32b", 32c" may have an observed polarity of +/−, while the second set of thermocouple junctions 34a", 34b", 34c" has an observed polarity of −/+, or vice versa.

Each of the thermocouple junctions 32a", 32b", 32c", 34a", 34b", 34c" is disposed adjacent to battery cells 52a, 52b, 52c, 52d, 52e, 52f. For example, as shown in FIG. 5, each of the thermocouple junctions 32a", 32b", 32c", 34a", 34b", 34c" is disposed immediately adjacent to and/or touching a respective battery cell 52a, 52b, 52c, 52d, 52e, 52f at measurement points 35a", 35b", 35c", 35d", 35e", 35f. Each thermocouple junction 32a", 32b", 32c", 34a", 34b", 34c" is disposed so as to measure relative temperature changes at its respective battery cell 52a, 52b, 52c, 52d, 52e, 52f at measurement points 35a", 35b", 35c", 35d", 35e", 35f. In some embodiments, the thermocouple junctions 32a", 32b", 32c", 34a", 34b", 34c" are located close to the center, or middle, of the cylindrical cell because typically, the electrochemical reaction that generates heat is concentrated in this area. The thermocouple junctions 32a", 32b", 32c", 34a", 34b", 34c" may be located in the same relative position on each cell.

The first set of thermocouple junctions 32a", 32b", 32c" and the second set of thermocouple junctions 34a", 34b", 34c" are connected to each other in series via a wire 36", or a series of wires 36". For example, and with reference to FIG. 5, junction 32a" may be connected to junction 33b", which in turn is connected to junction 32c", which is connected to junction 34c", which is connected to 34b", which is connected to 34a". Alternatively, junction 32a" may be connected to junction 34a", which in turn is connected to junction 32b", which is connected to junction 34b", which is connected to 32c", which is connected to 34c". Numerous other combinations of connections may be used to connect each of the first set of thermocouple junctions 32a", 32b", 32c" and the second set of thermocouple junctions 34a", 34b", 34c" in series.

Wires 36" of the temperature sensing circuit 30" attach the temperature sensing circuit 30" to a circuit board similar to the circuit board 40 shown in FIG. 1. The circuit board receives an electrical signal from the circuit 30. As described above in relation to the embodiments shown in FIGS. 1-4, in operation, because the first set of thermocouple junctions 32a", 32b", 32c" have a first observed polarity, the second set of thermocouple junctions 34a", 34b", 34c" have a second observed polarity that is opposite of the first polarity, and the thermocouple junctions 32a", 32b", 32c", 34a", 34b", 34c" are all connected in series, when each of the measurement points 35a", 35b", 35c", 35d", 35e", 35f of battery cell 52a, 52b, 52c, 52d, 52e, 52f are at the same temperature, the temperature sensing circuit 30" has a net voltage of zero (or approximately zero). However, when one or more of the measurement points has a temperature that is different from the other measurement points, indicating a potential fault condition in the battery 50, the temperature sensing circuit 30" has a net voltage that is greater or less than zero (or approximately zero). Again, as described above, if only one or a portion of the total number of measurement points 35a", 35b", 35c", 35d", 35e", 35f of battery cell 52a, 52b, 52c, 52d, 52e, 52f is at a different temperature, then the temperature sensing circuit 30" voltage will be proportional to the difference in temperature between the exceptional measurement(s) and the average temperature of all of the remaining measurement points 35a", 35b", 35c", 35d", 35e", 35f of battery cell 52a, 52b, 52c, 52d, 52e, 52f.

While systems and methods have been described and illustrated with reference to specific embodiments, those skilled in the art will recognize that modification and variations may be made without departing from the principles described above and set forth in the following claims. Accordingly, reference should be made to the following claims as describing the scope of the present invention.

What is claimed is:

1. An electricity meter comprising:
    a base;
    a plurality of current terminals; and
    a temperature sensing circuit, the temperature sensing circuit including a first set of thermocouple junctions having a first observed polarity and a second set of thermocouple junctions having a second observed polarity, the second observed polarity being the opposite of the first observed polarity, each of the thermocouple junctions of the first set and the second set disposed adjacent to a respective current terminal of the plurality of current terminals so as to measure relative temperature changes at the respective current terminal, and wherein each of the thermocouple junctions of the first set and the second set are disposed inside the base near an exit of each respective current terminal from the inside of the base to an outside,
    wherein each of the first set of thermocouple junctions and the second set of thermocouple junctions are connected to each other in series such that, in operation, when each of the current terminals are at the same temperature, the temperature sensing circuit has a net voltage of zero and when one or more of the current terminals has a temperature that is different from the other current terminals, the temperature sensing circuit has a net voltage that is greater or less than zero, and
    wherein the base includes a plurality of grooves molded therein, each of the thermocouple junctions of the first set and the second set disposed within a respective one of the plurality of grooves.

2. The electricity meter of claim 1, wherein thermocouple junctions of the first set alternate with thermocouple junctions of the second set along the series.

3. The electricity meter of claim 1, wherein the first set of thermocouple junctions are each connected to each other sequentially in series and the second set of thermocouple junctions are connected sequentially in series to the first set.

4. The electricity meter of claim 1, wherein the plurality of current terminals including a pair of line terminals and a pair of load terminals.

5. The electricity meter of claim 1, wherein the plurality of current terminals include three line terminals and three load terminals.

6. The electricity meter of claim 1, wherein the temperature sensing circuit is connected to a circuit board, the circuit board being disposed within a housing of the electricity meter.

7. A method of monitoring exceptional watt hour meter terminal temperature in an electricity meter having a base, a plurality of current terminals, and a temperature sensing circuit, the temperature sensing circuit including a first set of thermocouple junctions having a first observed polarity and a second set of thermocouple junctions having a second observed polarity, the second observed polarity being the opposite of the first observed polarity, each of the thermocouple junctions of the first set and the second set disposed adjacent to a respective current terminal of the plurality of current terminals and connected to each other in series, wherein each of the thermocouple junctions of the first set and the second set are disposed inside the base near an exit of each respective current terminal from the inside of the base to an outside, and wherein the base includes a plurality of grooves molded therein, each of the thermocouple junctions of the first set and the second set disposed within a respective one of the plurality of grooves, the method comprising:
    measuring relative temperature changes at each of the plurality of meter terminals using a voltage produced by each of the thermocouple junctions;
    determining, based on a net voltage in the temperature sensing circuit, if one or more of the current terminals has a temperature that is different from the other current terminals, wherein when each of the current terminals are at the same temperature, the temperature sensing circuit has a net voltage of zero and when one or more of the current terminals has a temperature that is different from the other current terminals, the temperature sensing circuit has a net voltage that is greater or less than zero.

8. The method of claim 7, wherein thermocouple junctions of the first set alternate with thermocouple junctions of the second set along the series.

9. The method of claim 7, wherein the first set of thermocouple junctions are each connected to each other sequentially in series and the second set of thermocouple junctions are connected sequentially in series to the first set.

10. The method of claim 7, wherein the plurality of current terminals including a pair of line terminals and a pair of load terminals.

11. The method of claim 7, wherein the plurality of current terminals include three line terminals and three load terminals.

12. The method of claim 7, wherein the temperature sensing circuit is connected to a circuit board, the circuit board being disposed within a housing of the electricity meter.

13. A temperature sensing circuit configured to measure variations in temperature at points throughout the circuit, the temperature sensing circuit comprising:
  an electricity meter having a base, the base including a plurality of grooves molded therein;
  a first set of thermocouple junctions having a first observed polarity; and
  a second set of thermocouple junctions having a second observed polarity, the second observed polarity being the opposite of the first observed polarity, each of the thermocouple junctions of the first set and the second set disposed adjacent to measurement points so as to measure relative temperature changes at the respective measurement points, each of the thermocouple junctions being electrically isolated from the measurement points each of the thermocouple junctions of the first set and the second set disposed within a respective one of the plurality of grooves,
  wherein each of the first set of thermocouple junctions and the second set of thermocouple junctions are connected to each other in series such that, in operation, when each of the measurement points are at the same temperature, the temperature sensing circuit has a net voltage of zero and when one or more of the measurements points has a temperature that is different from the other measurement points due to a fault condition at the one or more measurement points, the temperature sensing circuit has a net voltage that is greater or less than zero.

14. The temperature sensing circuit of claim 13, wherein thermocouple junctions of the first set alternate with thermocouple junctions of the second set along the series.

15. The temperature sensing circuit of 13, wherein the first set of thermocouple junctions are each connected to each other sequentially in series and the second set of thermocouple junctions are connected sequentially in series to the first set.

* * * * *